United States Patent
Wu et al.

(12) 
(10) Patent No.: US 6,569,731 B1
(45) Date of Patent: May 27, 2003

(54) METHOD OF FORMING A CAPACITOR DIELECTRIC STRUCTURE

(75) Inventors: Yung-Hsien Wu, Taipei (TW); Cheng-Che Lee, Taichung (TW)

(73) Assignee: Promos Technologies Inc., Hsinchu (TW)

(*) Notice: Subject to any disclaimer, the term of this patent is extended or adjusted under 35 U.S.C. 154(b) by 0 days.

(21) Appl. No.: 10/214,191

(22) Filed: Aug. 8, 2002

(51) Int. Cl.$^7$ ........................................... H01L 21/8242
(52) U.S. Cl. ........................ 438/238; 438/286; 438/396
(58) Field of Search ............................ 438/3, 238–259, 438/381, 386–399

(56) References Cited

U.S. PATENT DOCUMENTS 6,407,008 B1 * 6/2002 Jia et al. ..................... 438/773

* cited by examiner

*Primary Examiner*—Jey Tsai

(57) ABSTRACT

A method of forming capacitor dielectric structure. The method includes steps of providing a semiconductor substrate having at least a predetermined capacitor structure, using silicon nitride deposition to form a SiN layer on the predetermined capacitor structure, using a reoxidation process to grow an oxide layer on the SiN layer, and using a nitridation process with $N_2O$ as a reactive gas to form a nitridation layer on the oxide layer.

15 Claims, 4 Drawing Sheets

METHOD OF FORMING A CAPACITOR DIELECTRIC STRUCTURE

BACKGROUND OF THE INVENTION

1. Field of the Invention

The present invention relates to a deep trench capacitor of a dynamic random access memory (DRAM) cell and, more particularly, to a method of forming a capacitor dielectric structure to increase the capacitance of the deep trench capacitor.

2. Description of the Related Art

There is much interest in reducing the size of individual semiconductor devices in order to increase their density on an integrated circuit (IC) chip, thereby reducing size and power consumption of the chip, and allowing faster operation. In order to achieve a memory cell with a minimum size, the gate length in a conventional transistor must be reduced to decrease the lateral dimension of the memory cell. However, the shorter gate length will result in higher leakage currents that cannot be tolerated, and the voltage on the bit line must therefore also be scaled down. This reduces the charges stored on a storage capacitor, and thus requires a larger capacitance to ensure that stored charges are sensed correctly. Recently, in fabricating highly-integrated memory devices, such as dynamic random access memory (DRAM), a deep trench capacitor has been developed within a silicon substrate without consuming any additional wafer area.

In order to prolong the data retention time, the capacitance of the storage capacitor must be increased by either increasing the capacitor area, decreasing the effective dielectric thickness between the capacitor plates, or increasing the dielectric constant (k) of the capacitor dielectric. However, increasing the capacitor area conflicts with the need to shrink the memory cell, and reducing the dielectric thickness is difficult because the dielectric thickness has already been reduced to a practical minimum. Therefore, improving the capacitor dielectric with a high dielectric constant is a way to provide adequate capacitance in view of shrinking cell size. In a conventional method, a multi-layered oxide/nitride/oxide structure, serving as an ONO structure, is employed as the capacitor dielectric. Because the dielectric constant of the silicon nitride (k=7.6) is 1.5~2 times larger than that of the silicon oxide (k=3.9), the nitride layer in the ONO structure can increase the capacitance of the deep trench capacitor. The oxide layer in the ONO structure is employed to repair the damaged interface. Nevertheless, the critical thickness of the ONO structure has a limitation of 5~10 nm, the dielectric constant of the ONO structure only reaches approximately 7, and problems of difficult process, low yield, high process cost, and leakage current occur.

Recently, a stacked nitride/oxide layer, serving as a NO structure, has been employed to form the capacitor dielectric. FIG. 1 is a sectional diagram showing a conventional deep trench capacitor. A DRAM cell comprises a transistor 22 and a deep trench capacitor 20 having a bottom electrode plate 14, a capacitor dielectric layer 16 and an upper electrode plate 18. The bottom electrode plate 14 can be formed from the $n^+$-doped region in a silicon substrate 10 surrounding a deep trench 12 or from a doped-polysilicon layer that conformally covers the sidewall and the bottom of the deep trench 12. The capacitor dielectric layer 16, a NO structure, comprises a SiN liner deposited on the sidewall and bottom of the deep trench 12 by low pressure vapor deposition (LPCVD) and thin oxide layer grown on the SiN liner by re-oxidation process. The upper electrode plate 18 is formed by filling the deep trench 12 with a conductive layer.

In the NO structure, the SiN liner with a dielectric constant 1.5~2 times larger than the dielectric constant of the oxide layer has a thickness of 40~80 Å and combines with the oxide layer of 3 nm thickness, thus the capacitance of the deep trench capacitor 20 is effectively increased. However, there is still a problem of leakage current caused by the SiN liner. Also, during deposition of the SiN liner, the process gases, such as $SiH_4$ and $NH_3$, cause pinhole structure defects in the SiN liner. Although the oxide layer grown on the SiN liner can repair the defects, decrease the pinhole density and reduce leakage current to achieve a preferred distribution of breakdown voltage, the SiN liner is too thin to increase the dielectric constant of the NO structure. Thus, a method of increasing the dielectric constant of the capacitor dielectric layer 16 without exceeding the thickness limitation, thereby solving the aforementioned problems, is called for.

SUMMARY OF THE INVENTION

The present invention provides a method of forming a capacitor dielectric structure that is a NO structure with a nitride layer to increase the dielectric constant and ensure the electrical reliability of the capacitor dielectric structure.

The method of forming capacitor dielectric structure comprises steps of providing a semiconductor substrate having at least a predetermined capacitor structure, using silicon nitride deposition to form a SiN layer on the predetermined capacitor structure, using a reoxidation process to grow an oxide layer on the SiN layer, and using a nitridation process with $N_2O$ as a reactive gas to form a nitridation layer on the oxide layer.

Accordingly, it is a principle object of the invention to provide a method of forming a capacitor dielectric structure that may be applied to the formation of a deep trench capacitor or a stacked capacitor in DRAM.

It is another object of the invention to provide a nitridation layer on a NO structure to increase the dielectric constant of the capacitor dielectric structure.

Yet another object of the invention is to provide a nitridation layer on a NO structure to ensure the electrical property of the capacitor dielectric structure.

It is a further object of the invention to provide the capacitor dielectric structure to increase capacitance of a deep trench capacitor.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The present invention provides a method of forming a capacitor dielectric structure, which may be applied to the formation of a deep trench capacitor or a stacked capacitor in DRAM device. The capacitor dielectric structure is a NO structure with a nitride layer to increase the dielectric constant and ensure the electrical reliability of the capacitor dielectric structure.

Figure 1:
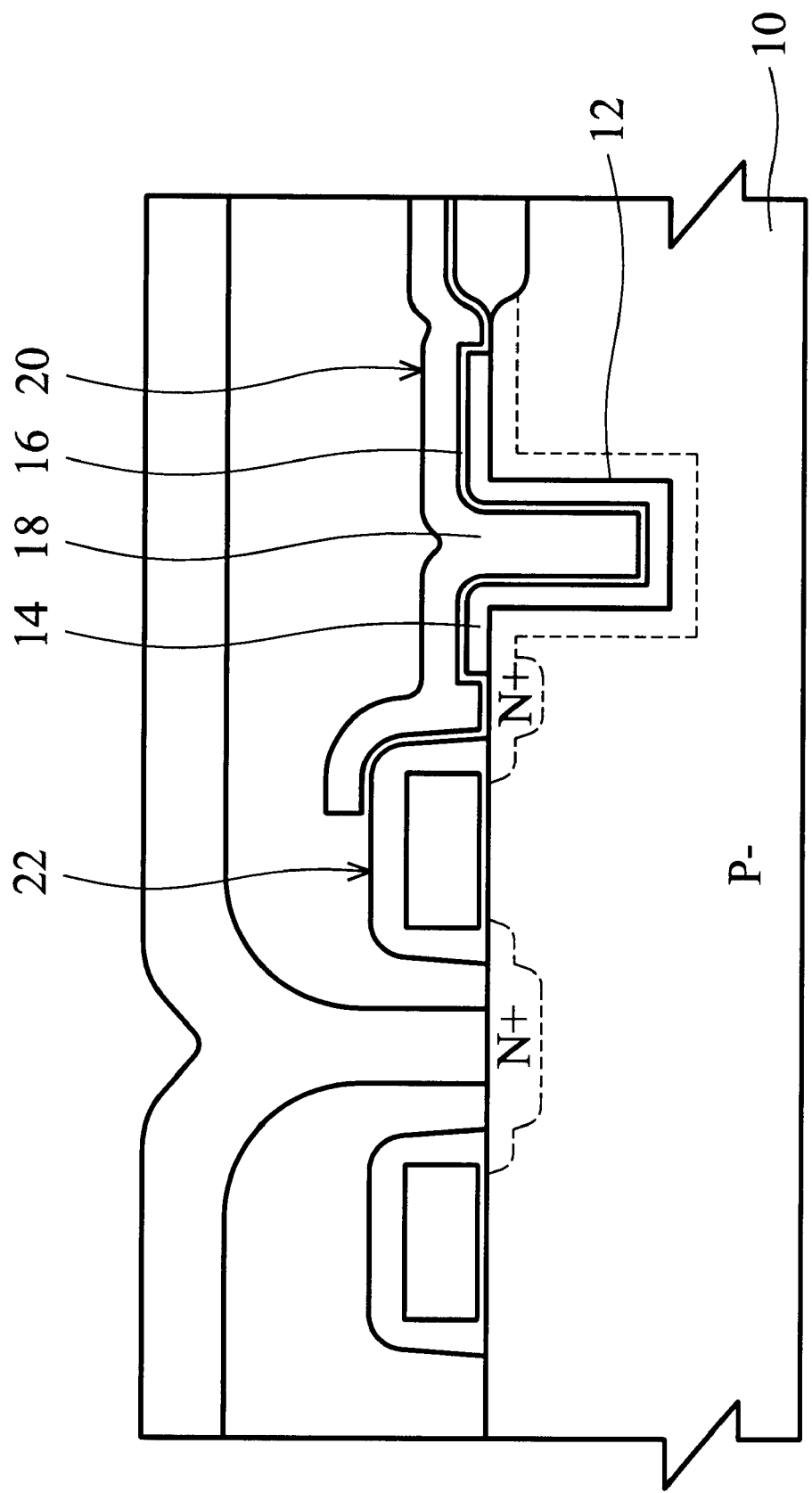
FIG. 1 is a sectional diagram showing a conventional deep trench capacitor.
Figure 2A:
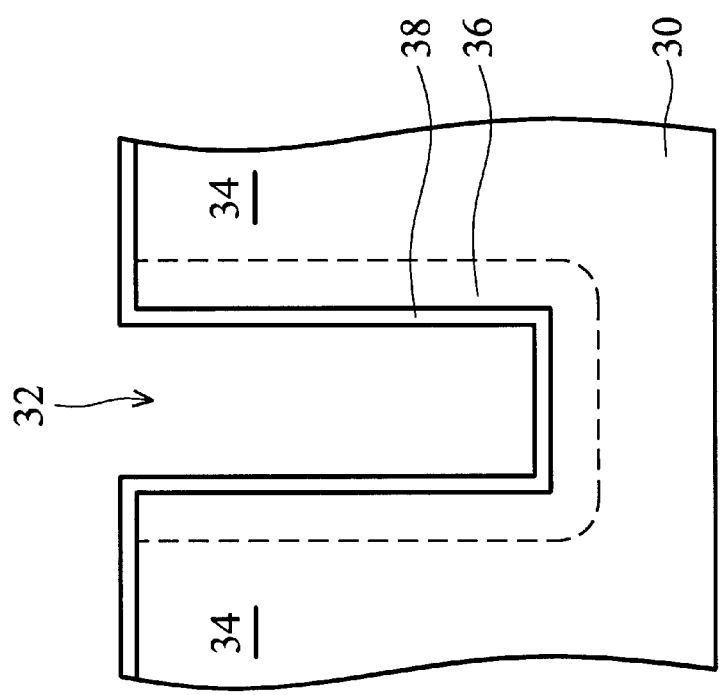
FIGS. 2A to 2D are sectional diagrams showing the method of forming the capacitor dielectric structure according to the present invention.
Figure 2B:
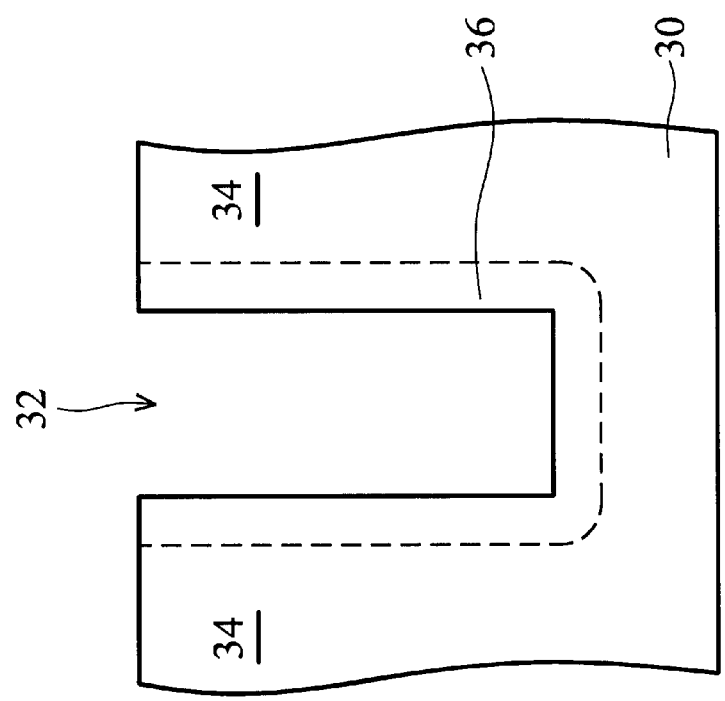
Figure 2C:
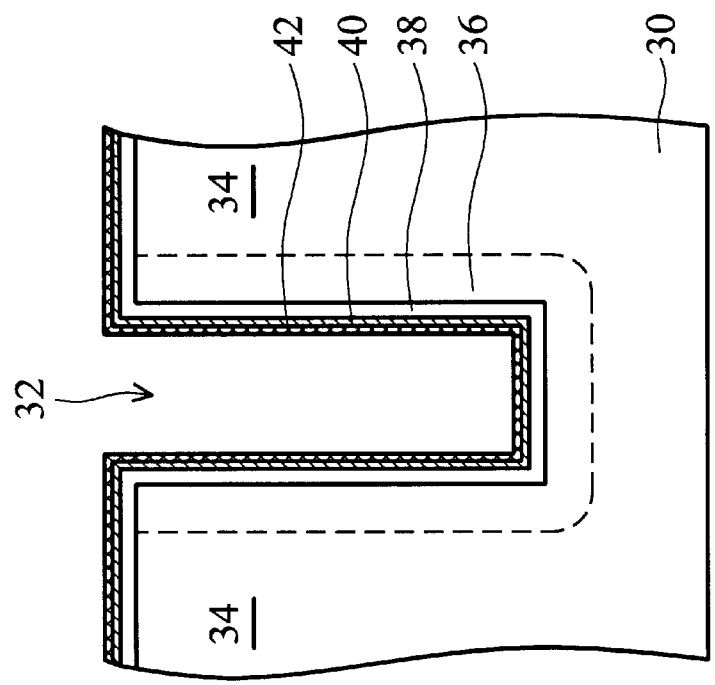
Figure 2D:
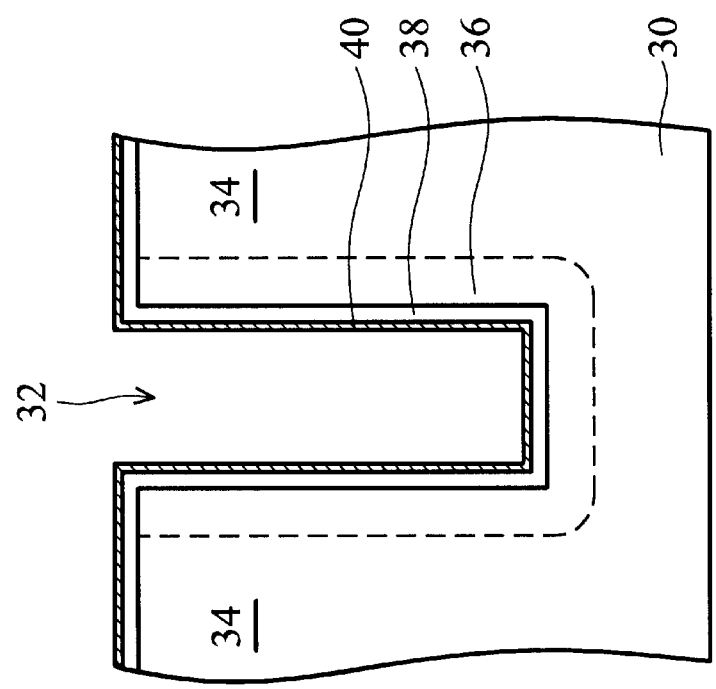
Figure 3:
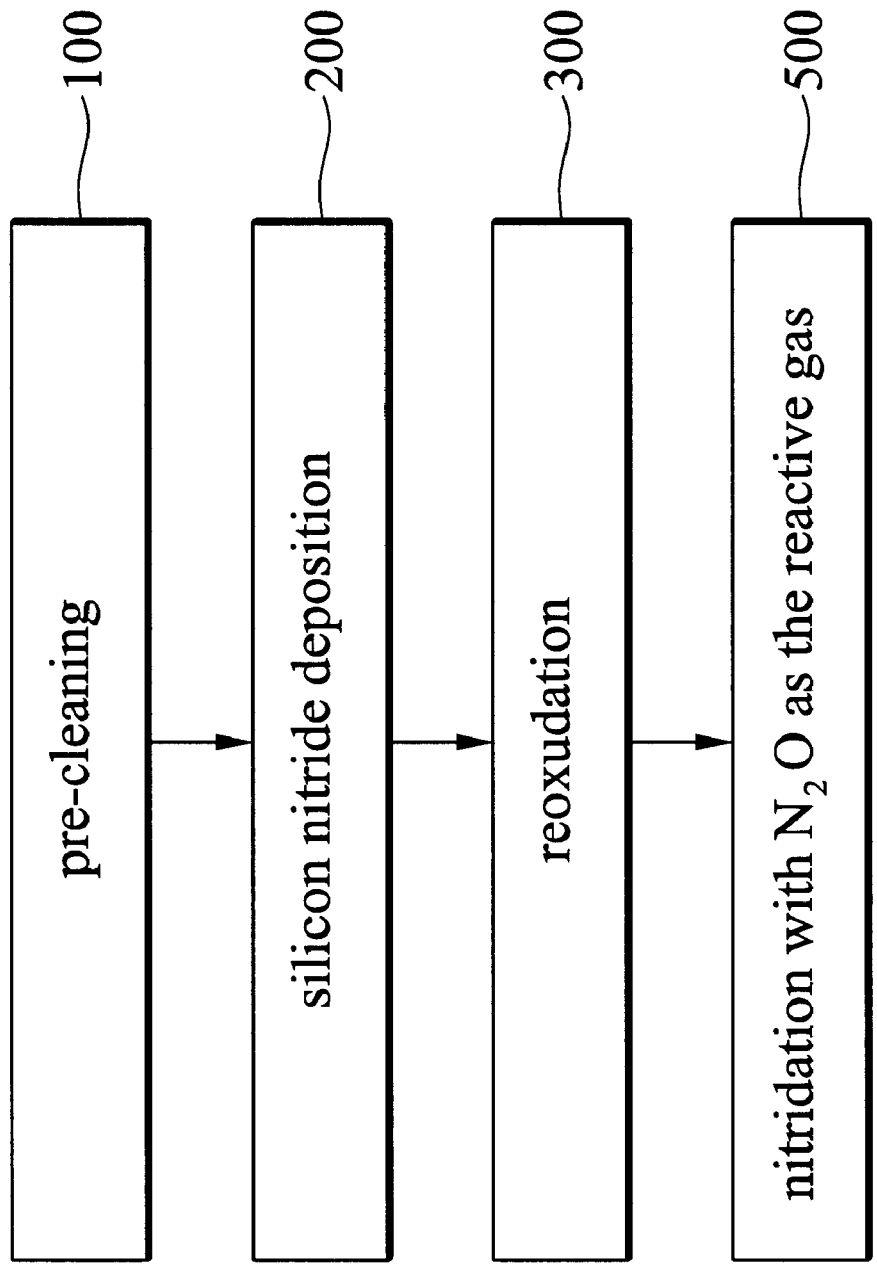
FIG. 3 is a flow diagram showing the method of forming the capacitor dielectric structure according to the present invention.

In the preferred embodiment, the method is applied to the deep trench capacitor process as shown in FIGS. 2 and 3. FIGS. 2A to 2D are sectional diagrams showing the method of forming the capacitor dielectric structure according to the present invention. FIG. 3 is a flow diagram showing the method of forming the capacitor dielectric structure according to the present invention. As shown in FIG. 2A, a semiconductor substrate 30 is provided with a deep trench 32 formed according to process designs and requirements. For example, using photolithography and etching, a plurality of deep trenches in array is formed in the p-type silicon substrate 30, thus the protruding portion of the silicon substrate 30 serves as pillar regions 34. Then, after successively depositing an ASG layer and an oxide layer on the sidewall of the deep trench 32, high-temperature annealing is used in a short term to diffuse As ions of the ASG layer into the silicon substrate 30, resulting in a n$^+$ diffusion region 36 in pillar region 34 surrounding the deep trench 32. The n$^+$ diffusion region 36 serves as a bottom electrode layer of a deep trench capacitor.

Next, at a step 100, a pre-cleaning process is used to clean the deep trench 32. Thereafter, at a step 200, silicon nitride deposition with 650~800□ deposition temperature is used to form a SiN layer 38 on the sidewall and bottom of the deep trench 32 as shown in FIG. 2B. Then, at a step 300, a reoxidation process using any rapid heating method is employed to grow an oxide layer 40 on the SiN layer 38 as shown in FIG. 2C. Preferably, the SiN layer 38 is 2.8 nm thick, and the oxide layer 40 is 1.2 nm thick.

Finally, at a step 500, a nitridation process with $N_2O$ as the reactive gas is performed in-situ to form a nitridation layer 42 on the oxide layer 40 as shown in FIG. 2D. In the nitridation process, the temperature is more than 700□, the process time is more than 30 minutes. Preferably, the process temperature is 800~1000□ (the best is 950□), the process time is 50~90 minutes (the best is 60 minutes), the pressure is 1 atmosphere, and the gas flow rate of $N_2O$ is 2000~4000 sccm. This completes a capacitor dielectric structure comprising the SiN layer 38, the oxide layer 40 and the nitridation layer 42.

Compared with the prior art of forming the capacitor dielectric structure, the present invention has thereinafter—described advantages improved by experiments. First, using the nitridation process with $N_2O$ as the reactive gas on the NO structure, the leakage current phenomenon found in the capacitor dielectric structure is effectively reduced. Second, the thickness of the SiN layer 38 is approximate 2.8 nm, and the thickness of the oxide layer 40 is reduced from 1.2nm to 1.0 nm, resulting in increase in the dielectric constant of the capacitor dielectric structure, and increasing 14% degree of the storage capacity of the deep trench capacitor. Third, even though a thickness of 2 Å is reduced from the oxide layer 40, it does not apparently reduce the leakage current phenomenon found in the capacitor dielectric structure. Thus, the present invention can both alleviate the leakage current phenomenon and increase the storage capacity. Fourth, since the operating environment at step 500 of the nitridation process performed at 1 atmosphere is the same as that at step 300 of the reoxidation process, there is no need to change facilities during the nitridation process. This reduces both cycle time and process costs.

It is to be understood that the present invention is not limited to the embodiments described above, but encompasses any and all embodiments within the scope of the following claims.

What is claimed is:

1. A method of forming capacitor dielectric structure, comprising steps of:

providing a semiconductor substrate having at least a predetermined capacitor structure;

using silicon nitride deposition to form a SiN layer on the predetermined capacitor structure;

using a reoxidation process to grow an oxide layer on the SiN layer; and using a nitridation process with $N_2O$ as a reactive gas to form a nitridation layer on the oxide layer.

2. The method according to claim 1, wherein the capacitor dielectric structure is applied to a deep trench capacitor.

3. The method according to claim 2, wherein the predetermined capacitor structure is a deep trench formed within the semiconductor substrate.

4. The method according to claim 3, wherein the SiN layer is formed on the sidewall and bottom of the deep trench.

5. The method according to claim 1, wherein the capacitor dielectric structure is applied to a stacked-type capacitor.

6. The method according to claim 1, further comprising a step of pre-cleaning the semiconductor substrate before the step of using silicon nitride deposition.

7. The method according to claim 1, wherein the silicon nitride deposition is at a temperature higher than 700□.

8. The method according to claim 1, wherein the nitridation process with $N_2O$ as the reactive gas is performed at 1 atmosphere.

9. The method according to claim 8, wherein the nitridation process with $N_2O$ as the reactive gas is performed in-situ.

10. The method according to claim 1, wherein the nitridation process is performed for more than 30 minutes.

11. A method of forming capacitor dielectric structure, comprising steps of:

providing a semiconductor substrate having at least a deep trench;

using silicon nitride deposition to form a SiN layer on the sidewall and bottom of the deep trench;

using a reoxidation process to grow an oxide layer on the SiN layer; and using a nitridation process with $N_2O$ as a reactive gas to form a nitridation layer on the oxide layer.

12. The method according to claim 11, wherein the silicon nitride deposition is at a temperature higher than 700□.

13. The method according to claim 11, wherein the nitridation process with $N_2O$ as the reactive gas is performed at 1 atmosphere.

14. The method according to claim 13, wherein the nitridation process with $N_2O$ as the reactive gas is performed in-situ.

15. The method according to claim 11, wherein the nitridation process is performed for more than 30 minutes.

* * * * *